US010461211B2

(12) United States Patent
Badano et al.

(10) Patent No.: US 10,461,211 B2
(45) Date of Patent: Oct. 29, 2019

(54) PROCESS FOR PRODUCING AN ARRAY OF MESA-STRUCTURED PHOTODIODES

(71) Applicant: Commissariat a l'energie atomique et aux energies alternatives, Paris (FR)

(72) Inventors: Giacomo Badano, Grenoble (FR); Clement Lobre, Grenoble (FR); Roch Espiau de Lamaestre, Grenoble (FR); Jean-Paul Chamonal, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 23 days.

(21) Appl. No.: 15/959,829

(22) Filed: Apr. 23, 2018

(65) Prior Publication Data

US 2018/0309016 A1    Oct. 25, 2018

(30) Foreign Application Priority Data

Apr. 24, 2017   (FR) ...................................... 17 53514

(51) Int. Cl.
| | | |
|---|---|---|
| *H01L 31/18* | (2006.01) | |
| *H01L 27/144* | (2006.01) | |
| *H01L 31/0352* | (2006.01) | |
| *H01L 31/103* | (2006.01) | |
| *H01L 31/02* | (2006.01) | |
| *H01L 31/0296* | (2006.01) | |
| *H01L 31/102* | (2006.01) | |

(52) U.S. Cl.
CPC ...... *H01L 31/1828* (2013.01); *H01L 27/1443* (2013.01); *H01L 31/02002* (2013.01); *H01L 31/02966* (2013.01); *H01L 31/035281* (2013.01); *H01L 31/102* (2013.01); *H01L 31/1032* (2013.01); *H01L 31/1832* (2013.01); *H01L 31/1868* (2013.01); *Y02E 10/50* (2013.01)

(58) Field of Classification Search
CPC .................................................... H01L 31/1828
See application file for complete search history.

(56) References Cited

U.S. PATENT DOCUMENTS

| | | | |
|---|---|---|---|
| 2009/0251946 A1* | 10/2009 | Juengling | ............. H01L 27/105 365/149 |
| 2016/0380017 A1 | 12/2016 | Marion | |
| 2017/0092371 A1* | 3/2017 | Harari | ................ G11C 16/3431 |

OTHER PUBLICATIONS

French Preliminary Search Report dated Dec. 26, 2017 in French Application 17 53514 filed on Apr. 24, 2017(with English Translation of Categories of Cited Documents and Written Opinion).
(Continued)

*Primary Examiner* — Xia L Cross
(74) *Attorney, Agent, or Firm* — Oblon, McClelland, Maier & Neustadt, L.L.P.

(57) ABSTRACT

The invention pertains to a process for producing an array (1) of mesa-structured photodiodes (2), including at least the following steps:
a) producing a useful layer (3);
b) producing an etch mask formed of a plurality of etch pads (20);
c) wet-etching part of the useful layer (3) located between the etch pads (20), forming a plurality of mesa-structured photodiodes (2), producing a recess (21);
d) conformally depositing a passivation layer (14);
e) removing the etch pads (20) by chemical dissolution;
f) producing conductive pads (11).

12 Claims, 5 Drawing Sheets

(56) References Cited

OTHER PUBLICATIONS

Demir, H. et al. "Self-Aligning Planarization and Passivation for Integration Applications in III-V Semiconductor Devices," IEEE Transactions on Semiconductor Manufacturing, vol. 18., No. 1, Feb. 2005, pp. 182-189.

* cited by examiner

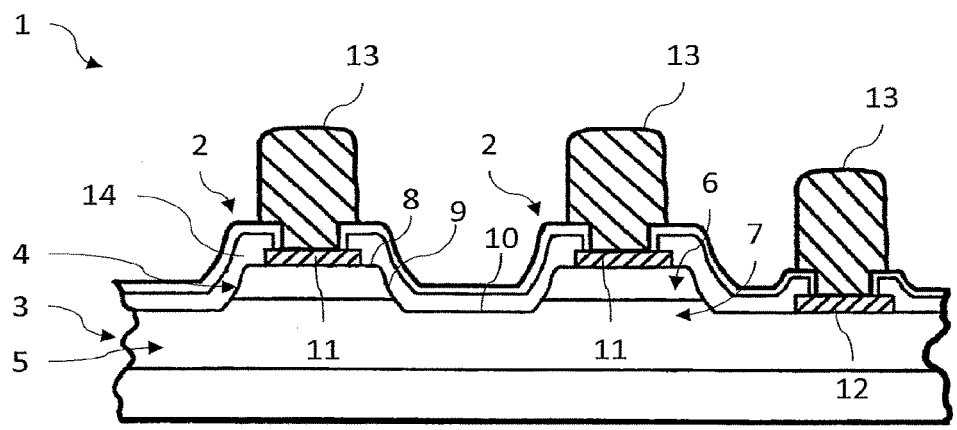
Fig.1A
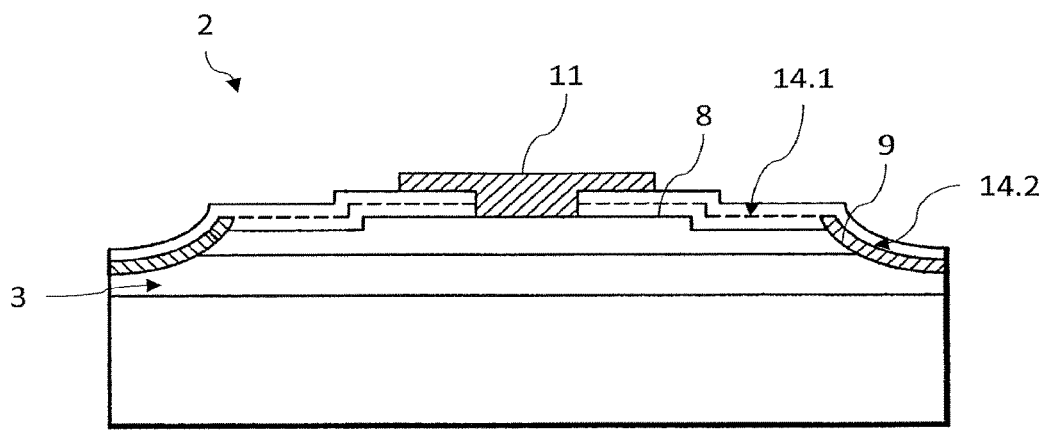
Fig.1B
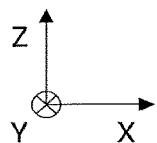

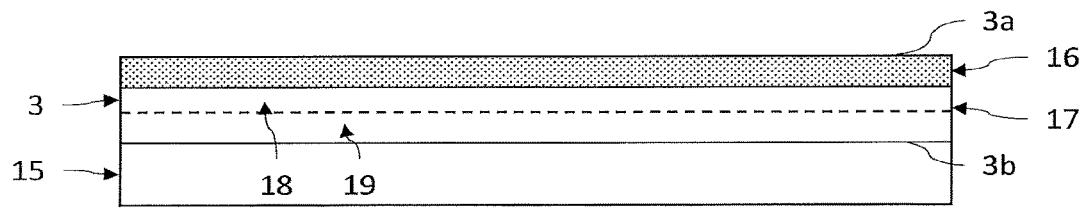
Fig.2A
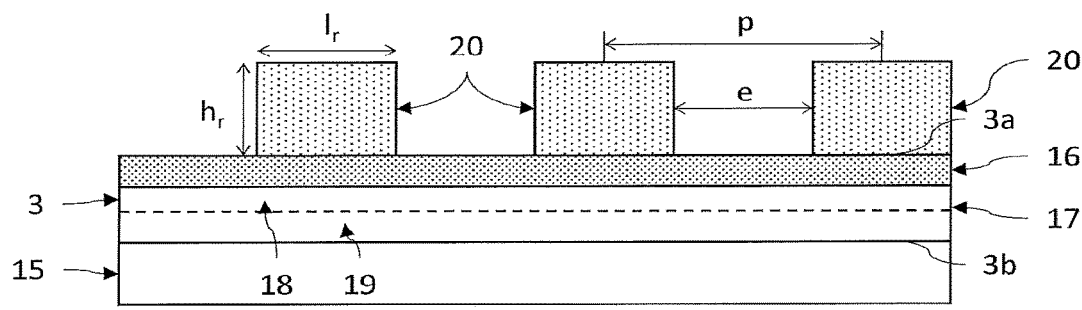
Fig.2B
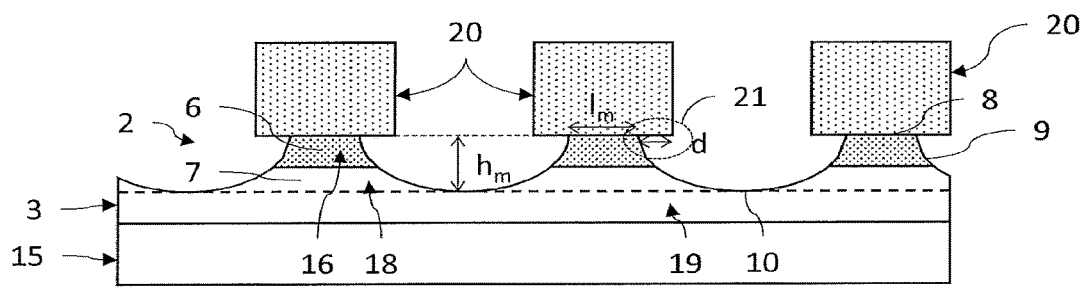
Fig.2C
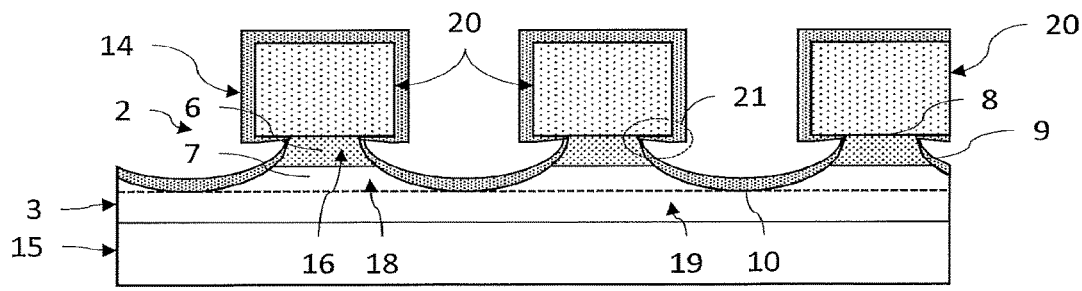
Fig.2D
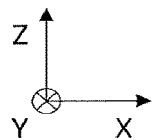

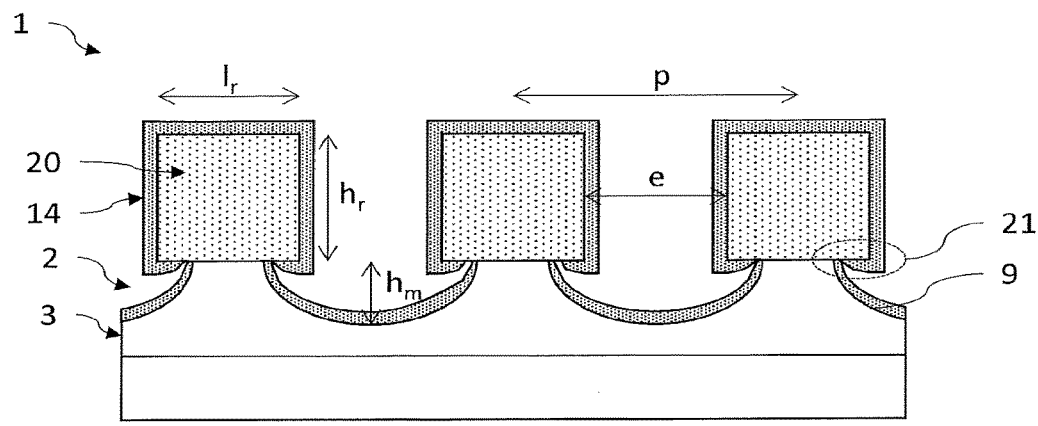
Fig.3A
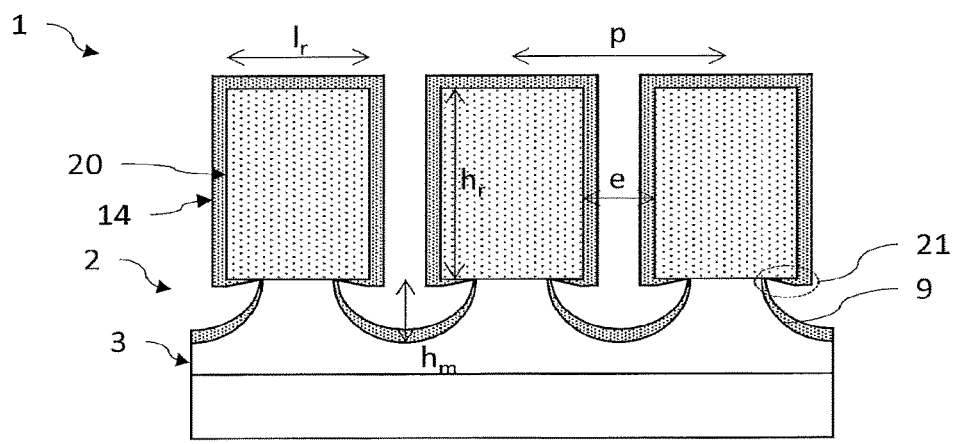
Fig.3B
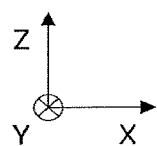

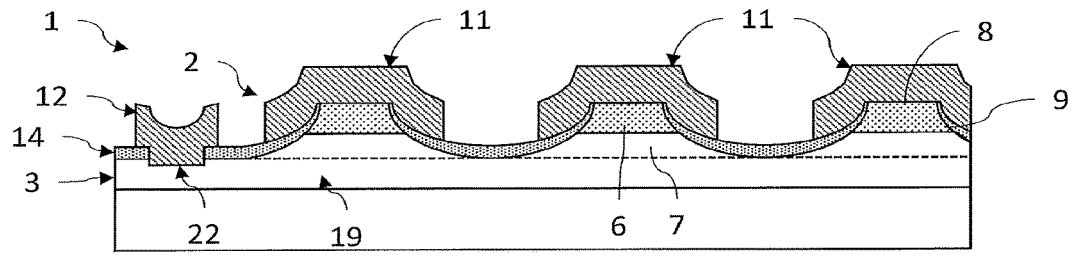
Fig.4
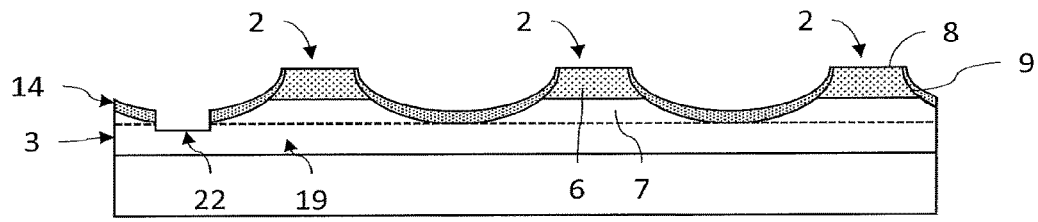
Fig.5A
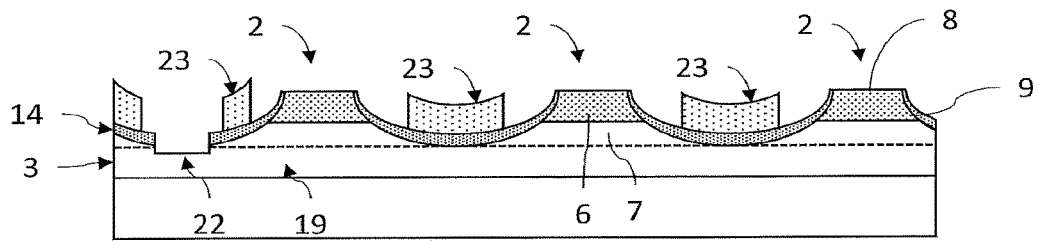
Fig.5B
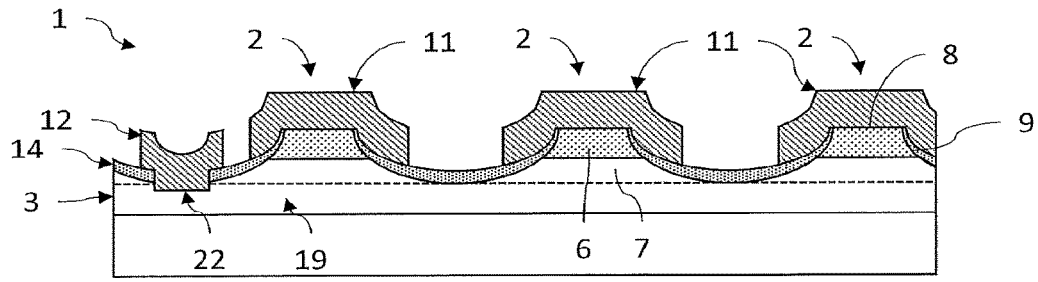
Fig.5C
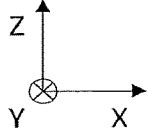

PROCESS FOR PRODUCING AN ARRAY OF MESA-STRUCTURED PHOTODIODES

TECHNICAL FIELD

The field of the invention is that of mesa-structured photodiodes, used in particular for detecting infrared radiation.

STATE OF THE PRIOR ART

FIG. 1A illustrates one example of an array 1 of mesa-structured photodiodes 2 made of CdHgTe such as described in document U.S. Pat. No. 5,401,986. Each photodiode 2 is structured like a mesa, that is to say it is formed of an upper part 4 of a layer, referred to as the useful layer 3, made of CdHgTe, this upper part 4 protruding with respect to a lower part 5 of the useful layer 3, referred to as the base, extending below the photodiodes 2. Each upper part 4 includes a first portion 6, which is here p-doped, covering a second portion 7, which is here n-doped, so as to form a p-n junction. Each mesa structure 2, i.e. the part 4 protruding with respect to the base 5, has its own p-n junction, thus forming a photodiode 2.

Each photodiode 2 includes an upper surface 8, the border of which is delimited by lateral surfaces 9 which form the flanks of the mesa structure 2. The flanks 9 of the adjacent structures 2 join up at a lower surface 10 which surrounds and delimits each mesa structure 2.

Each photodiode 2 further includes an electrically conductive pad, referred to as the diode contact 11, which is located in contact with the upper surface 8. The array 1 also includes at least one electrically conductive pad, referred to as the substrate contact 12, which is located in contact with the base 5. The diode contacts 11 and the substrate contact 12 are intended to bias the photodiodes 2 and to measure the electrical detection signal. To achieve this, they are intended to be connected to a readout circuit (not shown) via electrical interconnect elements 13 such as, for example, indium pads.

The flanks 9 of the photodiodes 2 are generally passivated by means of a layer referred to as the passivation layer 14. This layer is made of a semiconductor material, the properties of which make it possible to limit the recombination, at the site of the flanks 9, of photogenerated minority carriers, and to limit the detection noise linked in particular to the spontaneous creation of minority carriers by generation/recombination. This passivation material may thus have a bandgap energy that is higher than that of the useful layer 3, and may be, for example, CdTe, CdZnTe, or even CdSeTe.

The production process described in this document provides the following steps: forming the mesa structures 2; forming the diode contacts 11 on the upper surface 8; depositing the passivation layer 14 so as to cover the flanks 9 of the mesa structures 2 and the diode contacts 11; producing openings in the passivation layer 14 to expose a surface of the diode contacts 11; then forming the interconnect pads 13 made of indium.

However, this process envisages the use of multiple etch or deposition masks, and hence multiple steps of structuring the masks by means of photolithography, which may result in a lack of accuracy in the positioning of the diode contacts 11 and of the passivation layer 14 with respect to the mesa structures 2. This lack of accuracy in positioning may be particularly restrictive when wanting to produce an array 1 of photodiodes 2 with a small pitch, i.e. when the pitch is smaller than or equal to around 10 μm.

FIG. 1B illustrates another example of an embodiment of an array 1 of mesa-structured photodiodes 2, such as described in document U.S. Pat. No. 5,192,695, which allows the passivation layer, here made of a metal material, to be self-aligned with respect to the mesa structures 2.

The production process described in this document provides the following steps: depositing a first passivation layer 14.1 made of CdTe on the useful layer 3; forming the mesa structures 2; depositing a second passivation layer 14.2 made of a metal material, in this instance indium, on the flanks 9 of the mesa structures 2 and on the etch mask, followed by removing the etch mask and hence the part of the metal passivation layer 14.2 covering it; producing openings in the first passivation layer 14.1 to expose an upper surface 8 of the mesa structures 2; then forming the diode contacts 11.

The self-alignment of the metal passivation layer 14.2 with respect to the mesa structures 2 is achieved here by retaining, during the deposition of the metal passivation layer 14.2, the etch mask used to form the mesa structures 2. Since this passivation layer 14.2 is made of a metal material, in this instance indium, it is possible to chemically dissolve the etch mask, which results in the removal (lift-off) of the parts of the metal passivation layer 14.2 covering it. Thus, the metal passivation layer 14.2 is self-aligned with respect to the mesa structures 2.

However, to achieve the self-alignment of the passivation of the flanks 9, this process requires the second passivation layer 14.2 to be made of a metal material. Furthermore, this process may also lead to a lack of accuracy in the positioning of the diode contacts 11 with respect to the mesa structures 2, which may become restrictive when wanting to produce an array 1 of photodiodes 2 with a small pitch.

DISCLOSURE OF THE INVENTION

The object of the invention is to overcome, at least in part, the drawbacks of the prior art. To achieve this, the subject of the invention is a process for producing an array of mesa-structured photodiodes, including at least the following steps:

a) producing a layer, referred to as the useful layer, including an upper face and an opposite lower face, resting on a carrier layer via the lower face, including a stack of a first zone located at the upper face and having a first doping type, and of a second zone located between the first zone and the carrier layer having a second doping type, opposite the first type;

b) producing an etch mask positioned on said upper face, formed of a plurality of pads, referred to as etch pads, which are distinct from one another;

c) wet-etching part of the useful layer located between the etch pads, thus forming a plurality of mesa-structured photodiodes, each having an upper surface on which one of said etch pads rests, said wet etch being adapted so that the upper surface of each photodiode has a mean lateral dimension that is smaller than that of the corresponding etch pad, thus forming a recess between the etch pad and the corresponding photodiode;

d) conformally depositing, on the etch pads and the photodiodes, a passivation layer made of at least one dielectric or semiconductor material, with deposition conditions chosen so that the passivation layer has a local thickness that is less than or equal to 200 nm below the recess, and a columnar polycrystalline structure, the columns of which extend longitudinally along the thickness of the passivation layer with a constant transverse dimension, and are separated laterally from one another by grain boundaries;

e) removing the etch pads by chemical dissolution, thus leaving the upper surface exposed, a surface, referred to as the lateral surface, of the photodiodes, which surrounds the upper surface, being covered by the passivation layer;

f) producing electrically conductive pads on and in contact with the upper surface.

The deposition conditions relating to the local thickness of the passivation layer may conventionally be the duration of deposition, inter alis. The deposition conditions relating to the columnar polycrystalline structure may conventionally be the deposition pressure and temperature, as given in the Thornton diagram, and more specifically the ratio of the deposition temperature to the melting point of the deposited material. The layer located below the recess corresponds to a portion of the layer covering the zone of the flank of the photodiode located facing, i.e. perpendicularly to, the recess. A grain boundary is an interface, in the layer made of a crystalline material, between two crystals having the same crystallographic structure and the same composition, but oriented differently.

Certain preferred but nonlimiting aspects of this process are the following.

In the step of producing the conductive pads, each conductive pad may entirely cover the upper surface of the corresponding photodiode.

Each conductive pad may further cover part of a lateral surface of the corresponding photodiode which surrounds the upper surface.

The etch pads may be dimensioned and the wet etch may be adapted such that the ratio of a height of the etch pads to a depth of the photodiodes is higher than or equal to 2.

The etch pads may be dimensioned such that the ratio of a height of the etch pads to a spacing between two adjacent etch pads is higher than 1.

The photodiodes may be periodically spaced apart from one another by a pitch that is smaller than or equal to 10 μm.

The recess may have a dimension, along a direction parallel to a main plane of the useful layer, that is greater than 50 nm.

The useful layer may be made of a semiconductor alloy including elements from groups II and VI of the periodic table.

The passivation layer may be made of at least one semiconductor alloy including elements from groups II and VI of the periodic table.

The passivation layer may be deposited by sputtering.

The thickness of the passivation layer, at the lateral surface of the photodiodes, may decrease as it approaches the upper surface.

The step of producing the conductive pads may include an operation of depositing a continuous layer made of an electrically conductive material so as to cover the passivation layer and the upper surface of the photodiodes, followed by an operation of structuring the continuous layer to form mutually distinct conductive pads by means of photolithography and etching.

BRIEF DESCRIPTION OF THE DRAWINGS

Other aspects, aims, advantages and features of the invention will become more clearly apparent upon reading the following detailed description of preferred embodiments thereof, which description is provided by way of nonlimiting example and with reference to the appended drawings, in which:

FIGS. 1A and 1B, described above, are schematic and partial sectional views of arrays of mesa-structured photodiodes, according to examples of the prior art;

FIGS. 2A to 2H are schematic and partial sectional views of various steps of producing an array of mesa-structured photodiodes according to one example of an embodiment;

FIGS. 3A and 3B are schematic and partial sectional views of an array of mesa-structured photodiodes, for various examples of sizes of the etch pads;

FIG. 4 is a schematic and partial sectional view of an array of photodiodes in which the substrate contact is located in a zone of the useful layer not including mesa structures;

FIGS. 5A to 5C are schematic and partial sectional views of various steps of producing diode and substrate contacts of an array of mesa-structured photodiodes according to another example of an embodiment.

DETAILED DESCRIPTION OF PARTICULAR EMBODIMENTS

Figure 2E:
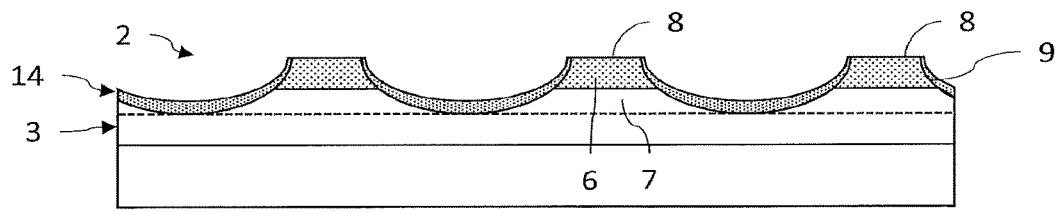

In the figures and in the subsequent description, the same references represent identical or similar elements. Moreover, the various elements are not represented to scale so as to enhance the clarity of the figures. Furthermore, the various embodiments and variants are not mutually exclusive and may be combined with one another. Unless indicated otherwise, the terms "substantially", "about" and "of the order of" mean to within 10%.

FIGS. 2A to 2H illustrate various steps of a process for producing an array of mesa-structured photodiodes according to one example of an embodiment. In this example, the useful layer is made of an alloy of cadmium, mercury and tellurium, in this instance CdHgTe, obtained by epitaxial growth from a growth substrate, referred to hereinafter as the carrier layer. The term "useful layer" is understood to mean a layer made of at least one semiconductor material, at least part of which is capable of absorbing the electromagnetic radiation to be detected.

An orthogonal three-dimensional direct coordinate system (X,Y,Z), in which the X- and Y-axes form a plane parallel to the plane of a carrier layer, and in which the Z-axis is oriented along the thickness of the layers, is defined here and will be referred to in the rest of the description. Throughout the remainder of the description, the terms "vertical" and "vertically" are understood as being relative to an orientation substantially parallel to the Z-axis. Additionally, the terms "lower" and "upper" are understood as being relative to positions in order of increasing distance from the carrier layer along the Z+ direction.

The useful layer is here made of a semiconductor material suitable for absorbing the electromagnetic radiation to be detected. It may be formed of an alloy of elements from groups II and VI of the periodic table. In this example, the semiconductor material is an alloy of cadmium, mercury and tellurium of the type $Cd_xHg_{1-x}Te$, with an atomic proportion x of cadmium comprised between 0 and 1, excluding the limits. The atomic proportion x of cadmium is chosen according to the electromagnetic radiation to be detected. By way of examples, it may be of the order of 0.22 when wanting to detect radiation in the far infrared (LWIR, long-wave infrared), be of the order of 0.3 when wanting to detect radiation in the middle infrared (MWIR, mid-wave infrared), or even be of the order of 0.4 when the radiation to be detected is in the near infrared (SWIR, short-wave infrared). Alternatively, the semiconductor material of the useful layer may be a material other than CdHgTe, and may be chosen from alloys including elements from groups III and V of the periodic table, for example InGaAs and InSb.

The semiconductor material of the growth substrate is chosen to have a good lattice parameter match with the semiconductor material of the useful layer. If the growth substrate is retained after producing the array of photodiodes, it is chosen also to be transparent to the wavelengths of the electromagnetic radiation to be detected. In the case in which the semiconductor material of the useful layer is made of CdHgTe, that of the growth substrate may be made of an alloy of cadmium, zinc and tellurium, for example made of CdZnTe.

With reference to FIG. 2A, the useful layer 3 is first epitaxially grown from the growth substrate 15, for example by means of molecular beam epitaxy (MBE), liquid phase epitaxy (LPE), or even by means of metalorganic chemical vapor deposition (MOCVD).

The useful layer 3 has a first face, referred to as the upper face 3a, and a second face, referred to as the lower face 3b, opposite the first face. This face makes contact with the carrier layer 15 via the lower face 3b.

The useful layer 3 here has a first zone 16, referred to as the upper zone, having a first n- or p-doping type, in this instance p-type, and a second zone 17, referred to as the lower zone, having a second n- or p-doping type, opposite the first type, in this instance n-type. As a variant, the doping types of the lower 17 and upper 16 zones may be inverted. The p-doped upper zone 16 extends in the plane XY of the useful layer 3, and extends along the Z-axis from the upper face 3a. The n-doped lower zone 17 also extends in the plane XY of the useful layer 3, and is located between the p-doped upper zone 16 and the lower face 3b.

In this example, and purely by way of illustration, the thickness of the useful layer 3 is of the order of 1.5 μm, the thickness of the n-doped lower zone 17 is around 1 μm, and that of the p-doped upper zone 16 is around 0.5 μm. The p-doped upper zone 16 may have a doping density of the order of $10^{18}$ atoms/cm$^3$, and the n-doped lower zone 17 a doping density of the order of $10^{15}$ atoms/cm$^3$. The various zones of the useful layer 3 may be doped by means of various known techniques. By way of example, the lower zone 17 may be n-doped during the epitaxial growth of CdHgTe by incorporating a dopant element, referred to as a donor element, for example boron or indium. The p-doping may be performed after growth of the useful layer 3 by ionically implanting a dopant element, referred to as an acceptor element, for example arsenic. One or more annealing steps may advantageously be carried out, with a view to diffusing and/or activating the dopant elements, or even filling in potential voids with mercury.

Advantageously, in this example, the n-doped lower zone 17 is formed of a first n-doped region 18, having a first doping density for example of the order of $10^{15}$ atoms/cm$^3$, which extends from the p-doped upper zone 16 along the Z-direction, and of a second n$^+$-doped region 19 having a second doping density that is higher than the first density, for example of the order of $10^{16}$ atoms/cm$^3$, which extends between the first n-doped region 18 and the lower face 3b. The thickness of the first n-doped region 18 may be around 0.5 μm and the thickness of the second n$^+$-doped region 19 may be around 0.5 μm. The n$^+$-doped region 19 forms part of the useful layer 3, referred to as the base, extending below all of the photodiodes 2 and intended to have one and the same electrical potential.

Advantageously, in this example, the n$^+$-doped region 19 has an atomic proportion of cadmium that is higher than those of the n-doped region 18 and of the p-doped upper zone 16. This n$^+$-doped region 19 then has a bandgap energy that is higher than those of the n-doped region 18 and of the p-doped upper zone 16, so as to prevent it absorbing at least part of the electromagnetic radiation to be detected. The atomic proportion of cadmium of the n-doped region 18 and the p-doped upper zone 16 is substantially identical. Variation in the atomic proportion of cadmium may be obtained during the growth of the useful layer 3, in particular when this layer is obtained by means of molecular beam epitaxy, inter alia.

With reference to FIG. 2B, an etch mask is deposited on the upper face 3a of the useful layer 3. The etch mask takes the shape of a plurality of pads 20, referred to as etch pads, which are distinct from one another, here arranged periodically. The etch mask may be a photoresist.

The etch pads 20 have a mean height along the Z-axis denoted by hr and a mean lateral dimension, in the plane XY, denoted by lr. Their section, in the plane XY, may be square, rectangular, polygonal or even circular, oval or other. The pads 20 are said to be thick in the sense that their height hr is greater than or equal to at least one tenth of the lateral dimension $l_r$, or even greater than or equal to one fifth of this lateral dimension lr, or even greater than or equal to this lateral dimension lr. The thick pads 20 thus differ from the masks, which take the shape of portions of thin film in which the height of the portions is less than at least one tenth of its lateral dimension.

The pads 20 are here periodically spaced apart from one another, with a pitch denoted by p, and are spaced apart from one another by a mean value denoted by e. Purely by way of illustration, in this example, the pitch p is equal to around 5 μm, and the etch pads 20 are pads having a circular section in the plane XY that is 2 μm in diameter and 3 μm high. Thus, two adjacent pads are spaced apart from one another by a mean distance e of the order of 1 μm. The section of the pads may be different, for example polygonal, such as square or rectangular, in shape.

With reference to FIG. 2C, a step of chemically etching the useful layer 3 to form an array 1 of mesa-structured photodiodes 2 is carried out. Chemical etching is a wet etch performed in liquid phase or in vapor phase, for example using an etchant such as bromine.

The useful layer 3 is thus partially removed from the exposed surface of the upper face 3a, thus forming a plurality of mesa structures 2 located below the etch pads 20. Each mesa structure 2 thus includes a p-doped portion 6 arising from the p-doped upper zone 16, surmounting an n-doped portion 7 arising from the n-doped region 18 of the lower zone 17. A plurality of mutually distinct p-n junctions is thus obtained, thus forming photodiodes 2.

Each mesa structure 2 thus has an upper surface 8 on which an etch pad 20 rests, along with lateral surfaces, or flanks 9, which here are exposed, i.e. not covered by the etch pad 20. The flanks 9 of the mesa structures 2 join up at a lower surface 10. The depth $h_m$ of the mesa structure 2 is thus defined as the maximum distance, along the Z-axis, between the lower surface 10 and the upper surface 8. Advantageously, the depth $h_m$ of the mesa structures 2 is such that the lower surface 10 is flush with or located level with the n$^+$-doped region 19. Crosstalk effects between the photodiodes 2, i.e. the possibility of a minority carrier photogenerated at one photodiode 2 being detected by a neighboring photodiode 2, are thus limited. Furthermore, the n$^+$-doped region 19 is advantageously not etched all the way through its thickness, so as to form a base extending below the photodiodes 2 which is intended for the later application of one and the same electrical potential to the set of photodiodes 2.

Since chemical etching is wet, the partial removal of the useful layer 3 from the exposed upper face 3a is substantially isotropic, i.e. it results in the removal of part of the useful layer 3 located below the exposed upper face 3a, but also of part of the useful layer 3 located below the etch pads 20. The upper surface 8 of the p-doped portions 6 therefore has a mean lateral dimension, denoted by $I_m$, in the plane XY, that is smaller than that $I_r$ of the etch pads 20. This results in the formation of a recess 21 between the lateral face of each etch pad 20 and the flanks 9 of the corresponding mesa structure 2, at the contact surface between the etch pad 20 and the mesa structure 2.

Because of this recess 21, each pad forms an overhang 21 over the flanks 9 of the mesa structure 2. This overhang 21, or this recess, has a dimension denoted by d, corresponding to the maximum distance between a lateral or vertical face of the etch pad 20 and the flank 9 facing the mesa structure 2, at the contact surface 8 between the etch pad 20 and the mesa structure 2. The dimension d is measured in a plane parallel to the main plane XY of the useful layer 3. The dimension d is of the order of a few tens of nanometers, and is advantageously greater than or equal to around 50 nm, for example equal to around 65 nm.

As will be described in detail below, it is advantageous for the height hr of the etch pads 20 and the depth hm of the mesa structures 2 to be such that the ratio hr/hm is higher than or equal to 2. This ratio may be achieved by sizing the etch pads 20 and by adjusting the wet-etch speed and/or time.

It is also advantageous for the etch pads 20 to be sized and spaced such that the ratio hr/e of the height hr of the pads to the spacing e between two adjacent pads 20 is higher than 1.

With reference to FIG. 2D, a passivation layer 14 is conformally deposited on the etch pads 20 and the flanks 9 of the mesa structures 2. The passivation layer 14 may be deposited by means of a conformal deposition technique such as physical vapor deposition, for example, sputtering, for example ion beam sputtering, or even atomic layer deposition. The passivation layer 14 thus covers the exposed faces of the etch pads 20, as well as the exposed surface of the mesa structures 2, namely the flanks 9 and the lower surface 10. The amount of material deposited is chosen such that the local thickness of the passivation layer 14 below the recess 21 is at most equal to 200 nm. This local thickness is measured below the recess 21, i.e. on the flank of the photodiode located perpendicularly to the recess 21. Furthermore, the deposition pressure and temperature are chosen beforehand so that the passivation layer 14 has a polycrystalline structure that is representative of zone 2 of the Thornton diagram. This diagram is presented in particular in the publication by J. A. Thornton, J. Vac. Sci. Technol. 11 (1974) 666. It illustrates the various microstructural zones of the deposited polycrystalline thin film, according to the ratio $T/T_f$ of the deposition temperature T to the melting point $T_f$ of the deposited material, and according to the deposition pressure. According to this diagram, at least three main zones may be obtained. A first zone, obtained for low values of $T/T_f$, corresponds to a microstructure of the deposited layer formed of fibrous and textured grains, the end surface of which is dome shaped. A second zone, obtained for intermediate values of $T/T_f$, for which the microstructure, having a higher density, is formed of columnar grains which extend longitudinally all the way through the thickness of the layer with a substantially constant transverse dimension along their longitudinal axis. The columns are separated laterally from one another by grain boundaries. Lastly, a third zone in which the microstructure is formed of grains which are not columnar, but equiaxial.

The passivation layer 14 is made of at least one semiconductor or dielectric material, and not of a metal material. In the case of at least one semiconductor material, it advantageously has a bandgap energy that is higher than that of the material of the mesas, and exhibits an electrical insulation property. By way of example, the passivation layer 14 may be formed of a first sublayer of CdTe coated with a second sublayer of ZnS. Such a passivation layer 14 thus has a bandgap energy that is higher than that of the CdHgTe of the mesa structures 2, and is an electrical insulator. Other passivation materials may be used, for example silicon oxides $SiO_x$. They may have a local thickness that is nonzero, going from a few tens of nanometers to a few hundreds of nanometers, for example comprised between 50 nm and 1000 nm, for example equal to around 500 nm. The amount of material deposited is however chosen such that the local thickness of the passivation layer 14 below the recess 21 is at most equal to 200 nm. Furthermore, the columnar polycrystalline structure representative of zone 2 of the Thornton diagram may be obtained for a deposition pressure of $10^{-3}$ mbar and a standardized temperature $T/T_f$ of the order of 0.1.

The inventors have demonstrated that the conformal deposition of a passivation layer 14 on the etch pads 20 and the flanks 9 of the mesa structures 2, performed such that the local thickness of the layer 14 deposited below the recess 21 remains less than or equal to 200 nm, with deposition conditions suitable for obtaining a layer 14 having a polycrystalline structure that is characteristic of zone 2 of the Thornton diagram, then allows a subsequent lift-off operation to be performed, while ensuring sufficient passivation of the flanks of the photodiode. Specifically, the decrease in the thickness of the passivation layer 14 as it approaches the contact line between the pads 20 and the mesa structures 2, in particular below the recess 21, associated with the crystallographic structure of the layer 14, will allow the etch pads 20 to be chemically dissolved in the following step. The density of the passivation layer 14 allows a good degree of passivation of the flanks of the photodiode to be provided, and its uniform columnar structure allows the diffusion of the solvent in the later lift-off step.

With reference to FIG. 2E, the etch pads 20 are then chemically dissolved using a solvent, which results in the removal of the part of the passivation layer 14 covering the etch pads 20 (lift-off). The removal of the pads is made possible by the thinness of the passivation layer 14 below the recess 21 and by its columnar structure representative of zone 2 of the Thornton diagram, which locally allow the solvent access to the etch pads 20.

Mesa-structured photodiodes 2 are thus obtained, the upper surface 8 of the p-doped portions 6 of which is exposed, i.e. not coated with another layer, and the flanks 9 of which are covered by the passivation layer 14. Stated otherwise, the self-alignment of the passivation layer 14 with respect to the mesa structures 2 is achieved in that the passivation layer 14 continually and entirely covers the flanks 9 without however covering the upper surface 8. Any lack of accuracy in the positioning of the passivation layer 14 with respect to the mesa structures 2 is thus avoided. Furthermore, this self-alignment of the passivation layer 14 is obtained by means of a technique of lifting off a semiconductor or dielectric passivating material, and not a metal material as in the example of the prior art provided above, which goes against the general knowledge of a person skilled in the art, who typically reserves the lift-off technique for metal materials.

An optional annealing step may be carried out, with a view to causing part of the cadmium contained in the passivation layer 14 to diffuse into a zone of the useful layer 3 bordering the flanks 9. This is followed by a local increase in the atomic proportion of cadmium in the active layer at the flanks 9 of the photodiodes 2, resulting in a local increase in the bandgap energy, and thus contributing to improving the quality of the passivation of the flanks 9 of the photodiodes 2.

The process for producing the array 1 of photodiodes 2 next includes steps of forming the diode contacts 11 and at least one substrate contact 12.

Figure 2F:
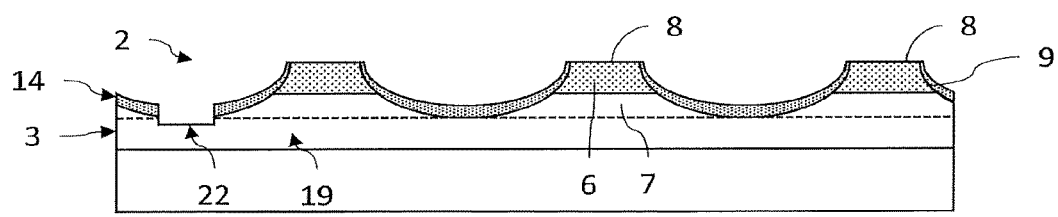

In the context of this embodiment, with reference to FIG. 2F, at least one indent 22 is made in the useful layer 3, with a view to the later production of at least one conductive pad allowing one and the same electrical potential common to all of the photodiodes 2 to be applied, namely the substrate contact 12. To achieve this, the indent 22 is made through the passivation layer 14 and the useful layer 3, until reaching the base, namely here the n$^+$-doped region 19. The indent 22 is obtained by means of conventional photolithography and etching steps. It may have a lateral dimension in the plane XY of the order of a few microns, for example comprised between 1 µm and 5 µm.

Figure 2G:
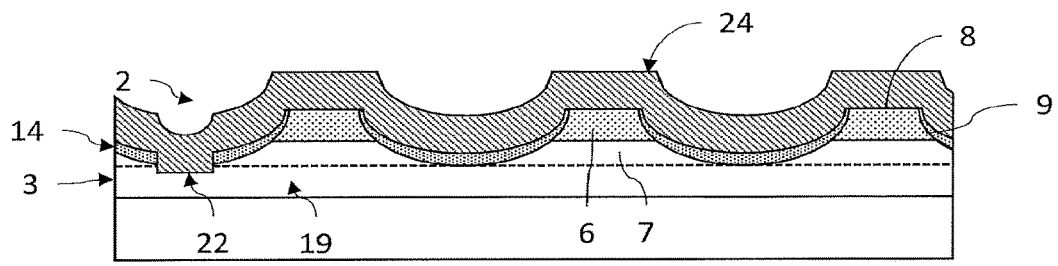
Figure 2H:
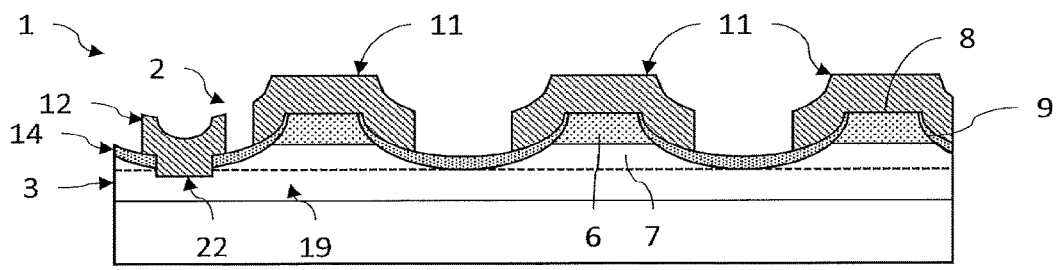

With reference to FIGS. 2G and 2H, the diode contacts 11 and the substrate contact 12 are produced, here simultaneously, preferably by means of a technique of self-aligning the diode contacts 11 with respect to the mesa structures 2.

To achieve this, one and the same electrically conductive layer 24 is deposited, which layer continually covers the passivation layer 14 and the upper surfaces 8 of the mesa structures 2. The conductive layer 24 thus covers the entire upper surface 8 of the p-doped portions 6 of the photodiodes 2 and comes into contact with the n$^+$-doped region 19 at the one or more indents 22. The thickness of the conductive layer 24 may be of the order of several microns, for example comprised between 1 µm and 5 µm, for example equal to around 1 µm, and be made of at least one electrically conductive material, such as a metal material, for example molybdenum.

The diode contacts 11 and the one or more substrate contacts 12 are then produced simultaneously by structuring the conductive layer 24, by means of conventional photolithography and etching steps. A plurality of mutually distinct conductive pads, namely the diode contacts 11 in contact with the upper surfaces 8 of the photodiodes 2, and at least one substrate contact 12 in contact with the base 19 of the useful layer 3, are thus obtained.

Advantageously, each diode contact 11 is structured such that it entirely covers the upper surface 8 of the p-doped portions 6 of the photodiodes 2.

Moreover, it is advantageous for each diode contact 11 also to cover part of the flanks 9 surrounding the upper surface 8 of the corresponding photodiode 2. The area of the diode contacts 11 is then larger than that of the upper surface 8 of the photodiodes 2.

Thus, the diode contacts 11 are self-aligned with respect to the photodiodes 2, thereby allowing inaccuracies in positioning to be avoided. Moreover, covering the flanks 9 of the photodiodes 2 by the diode contacts 11, at a zone in which the passivation layer 14 is liable to be thinner, allows the quality of the passivation to be improved. Preferably, the passivation layer 14 is covered by the diode contacts 11 over a distance, in the plane XY, that is greater than an equal to the dimension d of the overhang 21.

An array 1 of mesa-structured photodiodes 2 is thus obtained, in which the passivation layer 14 is self-aligned with respect to the mesa structures 2, i.e. this layer continuously covers the flanks 9 of the mesa structures 2 without covering the upper surface 8 thereof. Moreover, the diode contacts 11 are advantageously self-aligned with respect to the photodiodes 2, i.e. they entirely cover the upper surfaces thereof, as well as part of the passivation layer 14 surrounding the upper surfaces.

This production process is particularly advantageous when wanting to produce an array 1 of photodiodes 2 with a small pitch, for example a pitch smaller than or equal to 10 µm, or even smaller than or equal to 5 µm. Specifically, the passivation layer 14 and the diode contacts 11 remain aligned with respect to the photodiodes 2 without being affected by uncertainties in the positioning of the etch or deposition masks.

FIGS. 3A and 3B are schematic and partial sectional views of an array 1 of photodiodes 2 obtained following the step of depositing the passivation layer 14 described above with reference to FIG. 2D, here for various examples of sizes of the etch pads 20.

As mentioned above, with a view to facilitating the lift-off of the passivation layer 14 covering the etch pads 20, it is advantageous for the height hr of the etch pads 20 and the depth hm of the mesa structures 2 to be such that the ratio hr/hm is higher than or equal to 2.

In the example of FIG. 3A, the pitch p is of the order of 4 µm. The etch pads 20 have a height hr of around 2 µm and a mean lateral dimension of around 2 µm, and are therefore spaced apart by a mean distance e of 2 µm. The depth hm of the mesa structures 2 is of the order of 1 µm, and the dimension d of the recess 21 is around 65 nm. The ratio hr/hm is here equal to 2. The local thickness of the passivation layer 14 decreases as it approaches the upper surface 8, and hence the recess 21, which, due to the columnar structure of the passivation layer 14 (zone 2 of the Thornton diagram), thus allows the solvent access to the etch pads 20 in the step of chemically dissolving the pads and hence of lifting off part of the passivation layer 14.

Furthermore, this lift-off step is further facilitated when the etch pads 20 are sized and spaced such that the ratio hr/e of the height hr of the pads to the spacing e between the pads is higher than 1.

In the example of FIG. 3B, the pitch p is of the order of 3 µm. The etch pads 20 have a height hr of around 3 µm for a mean lateral dimension of around 2 µm. They are therefore spaced apart by a mean distance e of 1 µm. The depth hm of the mesa structures 2 is of the order of 1 µm, and the dimension d of the recess 21 is around 65 nm. The ratio hr/hm is here equal to around 3 and the ratio hr/e is equal to around 3. As illustrated in the figure, the local thickness of the passivation layer 14 decreases further as it approaches the contact line between the flanks 9 and the surface of the pads. This facilitates access of the solvent to the etch pads 20, thus further facilitating the lift-off step.

Particular embodiments have just been described. Various modifications and variants will be apparent to a person skilled in the art.

As illustrated in FIG. 4, as a variant of the preceding example of an embodiment in which the one or more substrate contacts 12 are located between two mesa structures 2, the one or more substrate contacts 12 may be located at a distance from the array 1 of photodiodes 2, in particular in a zone of the useful layer 3 having a substantially constant thickness and including no mesa structures.

Furthermore, as illustrated in FIGS. 5A to 5C, the diode contacts 11 and the one or more substrate contacts 12 may be produced, simultaneously or otherwise, by means of a lift-off technique. Following the formation of the one or more indents 22 (FIG. 5A), pads 23 of a deposition mask, for example a photoresist, are formed, by photolithography, on part of the passivation layer 14 not covering the upper surfaces 8 of the photodiodes 2 or the one or more indents 22 (FIG. 5B). Next, one and the same metal layer is deposited on the exposed surface of the array 1 of photodiodes 2, i.e. the surface not covered by the pads 23 of the mask, as well as on the pads 23 of the mask. The part of the conductive layer covering the pads is next removed (lifted off) by chemically dissolving the pads of the mask, which is possible because the conductive layer is here made of metal (FIG. 5C). An array 1 of mesa-structured photodiodes 2, identical or similar to that described in FIG. 2H, is thus obtained.

The array 1 of photodiodes 2 described above includes at least one substrate contact 12 produced at the upper face 3a of the useful layer 3, i.e. on the same side as that of the diode contacts 11. As a variant, the one or more substrate contacts 12 may be produced at the lower face 3b of the useful layer 3, in particular once the growth substrate has been removed.

The photodiodes described above each include a p-doped portion covering an n-doped portion (known as p-on-n technology). The doping types may of course be inverted, thus producing n-on-p photodiodes.

As mentioned above, the carrier layer may subsequently be removed. The mean thickness of the useful layer, and in particular of the base, is then adapted so as to provide the array of photodiodes with mechanical strength.

The array of mesa-structured photodiodes may advantageously include a plurality of resonant optical cavities, each produced in a pad of a dielectric material positioned facing a photodiode and optically coupled therewith. Such a resonant optical cavity may be identical to that described in application FR3032304.

The invention claimed is:

1. A process for producing an array of mesa-structured photodiodes, including at least the following steps:
   a) producing a layer, referred to as the useful layer, including an upper face and an opposite lower face, resting on a carrier layer via the lower face, including a stack of a first zone located at the upper face and having a first doping type, and of a second zone located between the first zone and the carrier layer having a second doping type, opposite the first type;
   b) producing an etch mask positioned on said upper face, formed of a plurality of pads, referred to as etch pads which are distinct from one another;
   c) wet-etching a part of the useful layer located between the etch pads, thus forming a plurality of mesa-structured photodiodes, each having an upper surface on which one of said etch pads rests, said wet etch being adapted so that the upper surface of each photodiode has a mean lateral dimension that is smaller than that of the corresponding etch pad, thus forming a recess between the etch pad and the corresponding photodiode;
   d) conformally depositing, on the etch pads and the photodiodes, a passivation layer made of at least one dielectric or semiconductor material, with deposition conditions chosen so that the passivation layer has a local thickness that is less than or equal to 200 nm below the recess, and a columnar polycrystalline structure, the columns of which extend longitudinally along the thickness of the passivation layer with a constant transverse dimension, and are separated laterally from one another by grain boundaries;
   e) removing the etch pads by chemical dissolution, thus leaving the upper surface exposed, a surface, referred to as the lateral surface of the photodiodes, which surrounds the upper surface, being covered by the passivation layer;
   f) producing electrically conductive pads on and in contact with the upper surface.

2. The process as claimed in claim 1, wherein, in the step of producing the conductive pads, each conductive pad entirely covers the upper surface of the corresponding photodiode.

3. The process as claimed in claim 2, wherein each conductive pad further covers part of a lateral surface of the corresponding photodiode which surrounds the upper surface.

4. The process as claimed in claim 1, wherein the etch pads are dimensioned and the wet etch is adapted such that the ratio of a height of the etch pads to a depth of the photodiodes is higher than or equal to 2.

5. The process as claimed in claim 1, wherein the etch pads are dimensioned such that the ratio of a height of the etch pads to a spacing between two adjacent etch pads is higher than 1.

6. The process as claimed in claim 1, wherein the photodiodes are periodically spaced apart from one another by a pitch that is smaller than or equal to 10 µm.

7. The process as claimed in claim 1, wherein the recess has a dimension, along a direction parallel to a main plane of the useful layer (3), that is greater than 50 nm.

8. The process as claimed in claim 1, wherein the useful layer is made of a semiconductor alloy including elements from groups II and VI of the periodic table.

9. The process as claimed in claim 8, wherein the passivation layer is made of at least one semiconductor alloy including elements from groups II and VI of the periodic table.

10. The process as claimed in claim 1, wherein the passivation layer is deposited by sputtering.

11. The process as claimed in claim 1, wherein the thickness of the passivation layer, at the lateral surface of the photodiodes, decreases as it approaches the upper surface.

12. The process as claimed in claim 1, wherein the step of producing the conductive pads includes an operation of depositing a continuous layer made of an electrically conductive material so as to cover the passivation layer and the upper surface of the photodiodes, followed by an operation of structuring the continuous layer to form mutually distinct conductive pads by means of photolithography and etching.

* * * * *